United States Patent
Kühnelt et al.

(10) Patent No.: US 10,615,323 B2
(45) Date of Patent: Apr. 7, 2020

(54) COMPONENT HAVING A REFLECTOR AND METHOD OF PRODUCING COMPONENTS

(71) Applicant: OSRAM Opto Semiconductors GmbH, Regensburg (DE)

(72) Inventors: Michael Kühnelt, Regensburg (DE); Alexander Linkov, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/092,026

(22) PCT Filed: Apr. 6, 2017

(86) PCT No.: PCT/EP2017/058256
§ 371 (c)(1),
(2) Date: Oct. 8, 2018

(87) PCT Pub. No.: WO2017/178332
PCT Pub. Date: Oct. 19, 2017

(65) Prior Publication Data
US 2019/0165225 A1  May 30, 2019

(30) Foreign Application Priority Data

Apr. 13, 2016 (DE) .......... 10 2016 106 833

(51) Int. Cl.
*H01L 33/52* (2010.01)
*H01L 33/60* (2010.01)
(Continued)

(52) U.S. Cl.
CPC ............ *H01L 33/60* (2013.01); *H01L 33/507* (2013.01); *H01L 33/52* (2013.01); *H01L 33/62* (2013.01);
(Continued)

(58) Field of Classification Search
None
See application file for complete search history.

(56) References Cited

U.S. PATENT DOCUMENTS 8,860,062 B2 * 10/2014 Schneider .............. H01L 33/60
257/432
9,281,458 B2 * 3/2016 Keith ..................... H01L 33/56
(Continued)

FOREIGN PATENT DOCUMENTS

DE         102 29 067 A1    1/2004
DE    10 2010 045 403 A1    3/2012
(Continued)

OTHER PUBLICATIONS

Nichia Corporation: "Specifications for White LED: NVSWE21AT" Nichia STS-DAI-3822H, Cat. No. 180420, p. 1-34.
(Continued)

*Primary Examiner* — Mohammed Shamsuzzaman
*Assistant Examiner* — Valerie N Newton
(74) *Attorney, Agent, or Firm* — DLA Piper LLP (US)

(57) ABSTRACT

A component includes a semiconductor chip, an envelope and a reflector, wherein the semiconductor chip has a front side, a rear side facing away from the front side and side faces, and the semiconductor chip is electrically contactable at least partially via its rear side, the reflector completely encloses the semiconductor chip in lateral directions, has a first subregion and a second subregion directly adjoining the first subregion, and the first subregion is spatially spaced from the semiconductor chip and the second subregion directly adjoins the semiconductor chip, the envelope covers the front side of the semiconductor chip completely and the side surfaces of the semiconductor chip at least partially so that the envelope has an interface facing the semiconductor chip and reproducing a contour of the semiconductor chip in
(Continued)

regions, and in the component is free of a lead frame enclosed by a molded body.

20 Claims, 6 Drawing Sheets

(51) Int. Cl.
    *H01L 33/50* (2010.01)
    *H01L 33/62* (2010.01)
(52) U.S. Cl.
    CPC ............... *H01L 2224/16245* (2013.01); *H01L 2224/48091* (2013.01); *H01L 2224/73265* (2013.01); *H01L 2224/8592* (2013.01); *H01L 2933/005* (2013.01); *H01L 2933/0058* (2013.01)

(56) References Cited

U.S. PATENT DOCUMENTS

| 2003/0230757 | A1 | 12/2003 | Suehiro et al. | |
|---|---|---|---|---|
| 2004/0089898 | A1* | 5/2004 | Ruhnau | H01L 31/0203 257/343 |
| 2006/0091788 | A1 | 5/2006 | Yan | |
| 2008/0218072 | A1* | 9/2008 | Haruna | H01L 33/508 313/506 |
| 2009/0095969 | A1 | 4/2009 | Kotani et al. | |
| 2009/0114937 | A1 | 5/2009 | Kawakubo | |
| 2010/0301357 | A1 | 12/2010 | Chen et al. | |
| 2012/0302124 | A1 | 11/2012 | Imazu | |
| 2013/0200411 | A1 | 8/2013 | O'Brien et al. | |
| 2013/0328091 | A1 | 12/2013 | Fuke et al. | |
| 2015/0091035 | A1 | 4/2015 | Kim et al. | |
| 2015/0166847 | A1 | 6/2015 | Morita et al. | |
| 2015/0207045 | A1 | 7/2015 | Wada et al. | |
| 2015/0311405 | A1 | 10/2015 | Oyamada et al. | |
| 2016/0093780 | A1 | 3/2016 | Beppu et al. | |

FOREIGN PATENT DOCUMENTS

| DE | 102014107964 A1 | 12/2015 |
|---|---|---|
| JP | 5611492 B1 | 10/2014 |
| JP | 5775002 B2 | 9/2015 |
| KR | 10-2009-0046701 A | 5/2009 |
| KR | 10-2014-0026163 A | 3/2014 |

OTHER PUBLICATIONS

Notification of Reason for Refusal dated Nov. 5, 2019, of counterpart Korean Application No. 10-2018-7031161, along with an English translation.

* cited by examiner

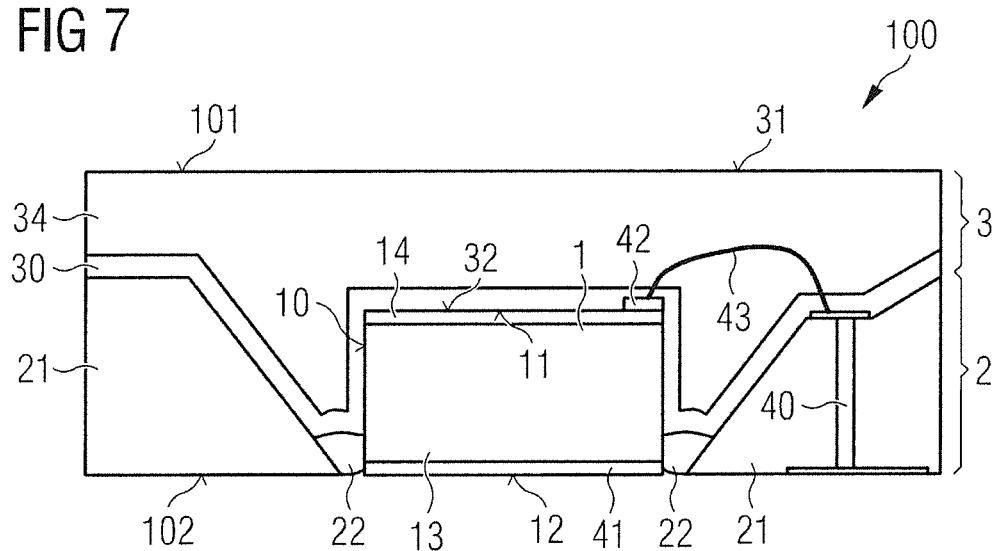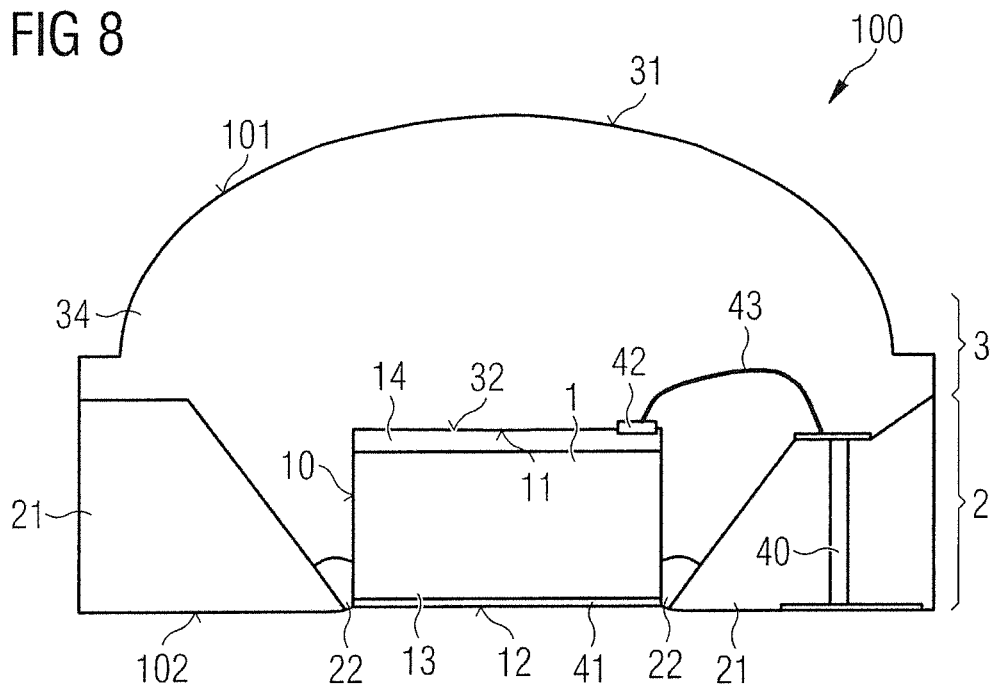

COMPONENT HAVING A REFLECTOR AND METHOD OF PRODUCING COMPONENTS

TECHNICAL FIELD

This disclosure relates to a component comprising a reflector and a method of producing a plurality of such components.

BACKGROUND

Chip-scale packages (CSPs) often suffer from problems regarding efficiency and color inhomogeneities over radiation angles. In such a chip arrangement it often happens that light is emitted in a backward direction, often resulting in light loss and thus in reduced efficiency of the chip arrangement. The reduction of efficiency due to backward light emission is particularly significant for volume emitters. The color inhomogeneity is often due to different optical path lengths of the emitted or converted light in different directions throughout the chip arrangement.

It could therefore be helpful to provide a component having an increased efficiency and increased color homogeneity over radiation angles as well as a cost-effective and simplified method of producing one or a plurality of such components.

SUMMARY

We provide a component including a semiconductor chip, an envelope and a reflector, wherein the semiconductor chip has a front side, a rear side facing away from the front side and side faces, and the semiconductor chip is electrically contactable at least partially via its rear side, the reflector completely encloses the semiconductor chip in lateral directions, has a first subregion and a second subregion directly adjoining the first subregion, and the first subregion is spatially spaced from the semiconductor chip and the second subregion directly adjoins the semiconductor chip, the envelope covers the front side of the semiconductor chip completely and the side surfaces of the semiconductor chip at least partially so that the envelope has an interface facing the semiconductor chip and reproducing a contour of the semiconductor chip in regions, and in the component is free of a lead frame enclosed by a molded body.

We also provide a method of producing a plurality of the components including a semiconductor chip, an envelope and a reflector, wherein the semiconductor chip has a front side, a rear side facing away from the front side and side faces, and the semiconductor chip is electrically contactable at least partially via its rear side, the reflector completely encloses the semiconductor chip in lateral directions, has a first subregion and a second subregion directly adjoining the first subregion, and the first subregion is spatially spaced from the semiconductor chip and the second subregion directly adjoins the semiconductor chip, the envelope covers the front side of the semiconductor chip completely and the side surfaces of the semiconductor chip at least partially so that the envelope has an interface facing the semiconductor chip and reproducing a contour of the semiconductor chip in regions, and in the component is free of a lead frame enclosed by a molded body, including providing a plurality of semiconductor chips and arranging the semiconductor chips into a plurality of rows and columns; applying a common reflector to the regions between the rows and columns of the semiconductor chips such that the semiconductor chips are each surrounded by the common reflector in lateral directions; applying a common envelope to the semiconductor chips and to the common reflector such that in a plan view, the common envelope completely covers the semiconductor chips; and singulating the components by separating the common reflector in the regions between the rows and columns of the semiconductor chips so that the components each include at least one semiconductor chip, one reflector and one envelope.

We further provide a component including a semiconductor chip, an envelope and a reflector, wherein the semiconductor chip has a front side, a rear side facing away from the front side and side faces, and the semiconductor chip is electrically contactable at least partially via its rear side, the reflector completely encloses the semiconductor chip in lateral directions, has a first subregion and a second subregion directly adjoining the first subregion, and the first subregion is spatially spaced from the semiconductor chip and the second subregion directly adjoins the semiconductor chip, the envelope covers the front side of the semiconductor chip completely and the side surfaces of the semiconductor chip at least partially so that the envelope has an interface facing the semiconductor chip and reproducing a contour of the semiconductor chip in regions, the component has a rear side including the rear side of the semiconductor chip and a rear side the reflector, for the purpose of external electrical contacting, the semiconductor chip has a freely accessible first contact layer on its rear side, and at least in regions, the semiconductor chip is attached to the first subregion of the reflector by the envelope in a mechanically stable manner.

We also further provide a component including a semiconductor chip, an envelope and a reflector, wherein the semiconductor chip has a front side, a rear side facing away from the front side and side faces, and the semiconductor chip is electrically contactable at least partially via its rear side, the reflector completely encloses the semiconductor chip in lateral directions, has a first subregion and a second subregion directly adjoining the first subregion, the first subregion is spatially spaced from the semiconductor chip and the second subregion directly adjoins the semiconductor chip, and the first subregion and the second subregion have the same material composition, the reflector has a cavity whose inner surfaces have different curvatures in different areas, and the envelope covers the front side of the semiconductor chip completely and the side surfaces of the semiconductor chip at least partially so that the envelope has an interface facing the semiconductor chip and reproducing a contour of the semiconductor chip in regions.

BRIEF DESCRIPTION OF THE DRAWINGS

FIGS. 1, 2, 3, 4, 5, 6, 7 and 8 show different examples of a component in schematic sectional views.

LIST OF REFERENCE NUMERALS

Figure 1:
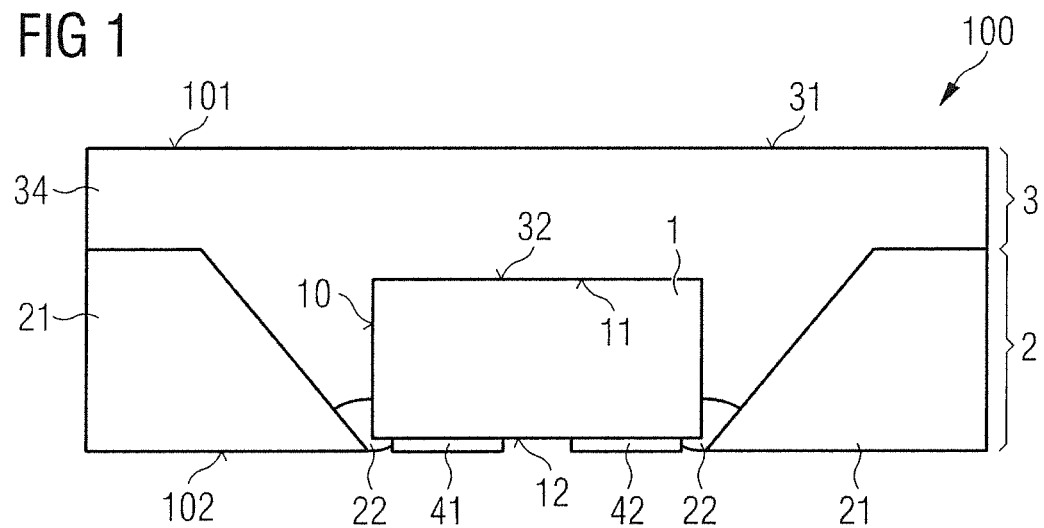

100 Component
101 Front side of the component
102 Rear side of the component
1 Semiconductor chip
10 Side surface of the semiconductor chip
11 Front side of the semiconductor chip
12 Rear side of the semiconductor chip
13 Substrate
14 Functional layer stack 2 Reflector
20 Common reflector
21 First subregion of the reflector
22 Second subregion of the reflector
23 Third subregion of the reflector
3 Envelope
30 Converter layer
31 Surface of the envelope
32 Interface of the envelope
33 Common envelope
34 Casting layer
40 Through-via
41 First contact layer of the semiconductor chip
42 Second contact layer of the semiconductor chip
43 Connection means
5 Carrier layer
51 First sublayer of the carrier layer
52 Second sublayer of the carrier layer

DETAILED DESCRIPTION

Our component may have a semiconductor chip, an envelope and a reflector. The semiconductor chip has a front side, a rear side facing away from the front side and side surfaces. In particular, the semiconductor chip is formed as a volume emitter. In a volume emitter, electromagnetic radiation generated during operation of the semiconductor chip can escape from the semiconductor chip via the front and side surfaces, for example. The semiconductor chip can be electrically contacted at least partially via its rear side. The semiconductor chip can have at least one electrical contact layer or two electrical contact layers of different polarities on its rear side. The reflector is formed such that it completely surrounds the semiconductor chip in lateral directions. The reflector can have a first subregion and a second subregion directly adjoining the first subregion, wherein the first subregion is spatially spaced apart from the semiconductor chip and the second subregion in particular directly adjoins the semiconductor chip. The second subregion can be adjacent to side surfaces and/or to at least one contact layer of the semiconductor chip. The envelope covers the front side of the semiconductor chip in particular completely and the side surfaces of the semiconductor chip at least partially. The envelope thus has an interface facing the semiconductor chip and reproduces a contour of the semiconductor chip in regions. The interface can be a common surface of the envelope and the semiconductor chip. The envelope can be formed in a single-layered or multi-layered fashion. In particular, the interface delimits the spatial extent of the envelope in a vertical direction.

A vertical direction is a direction perpendicular to a main extension surface of the front and/or of the rear side of the semiconductor chip. A lateral direction is a direction parallel to the main extension surface. The vertical direction and the lateral direction are therefore particularly perpendicular to each other.

By forming the reflector, according to which the reflector completely surrounds the semiconductor chip in lateral directions and has a subregion directly adjoining the semiconductor chip and establishes a mechanical connection between the semiconductor chip and a further subregion of the reflector, light emissions in the backward direction, i.e., in the direction of the rear side, and thus potential light losses can be avoided. The second subregion of the reflector can also serve as an adhesive bond between the semiconductor chip and the first subregion of the reflector, which is spatially spaced apart from the semiconductor chip.

In particular, the second subregion of the reflector partially covers the rear side and/or the side surfaces of the semiconductor chip adjacent to the rear side. The side surfaces can thus have areas remaining uncovered by the second subregion of the reflector so that electromagnetic radiation emitted by the semiconductor chip during operation of the component can still escape from the semiconductor chip at the side surfaces. Due to the first subregion of the reflector, which is spatially spaced apart from the semiconductor chip, the shape of the reflector can still be freely formed so that the radiation characteristics of the component can be adjusted with regard to brightness distribution or color homogeneity over radiation angles by the freely designable shape of the reflector. Since the side surfaces of the semiconductor chip are not or at most partially covered directly by the reflector, light extraction from the semiconductor chip can be enhanced resulting in an increase of the efficiency of the component.

In the component, the semiconductor chip can be electrically contacted via the reflector or throughout the reflector. If the semiconductor chip is electrically connectable throughout the reflector, the reflector can be formed to be electrically insulating. In particular, the rear side of the reflector may have an opening through which the semiconductor chip can be electrically connected to an external voltage source. It is also possible for the reflector to have a through-via extending in the vertical direction throughout the reflector for electrically contacting the semiconductor chip.

The component may have a rear side comprising the rear sides of the semiconductor chip and the reflector, wherein electrical contact layers of the semiconductor chip and/or of the component are freely accessible on the rear side of the component. The rear side of the semiconductor chip and the rear side of the reflector can be flush with each other in places. When the semiconductor chip can be electrically contacted via the reflector, the reflector is expediently electrically conductive. The semiconductor chip can be in electrical contact with the reflector. The electrically conductive reflector can have regions that are electrically isolated from each other to avoid a possible short circuit. If the semiconductor chip is externally electrically connectable via the reflector or throughout the reflector, the component can be particularly compact with a low overall height. The component can be free of metallic carrier elements, e.g., of a lead frame enclosed by a molded body, and in particular free of conductor tracks on the reflector or within the cavity of the reflector.

The envelope may comprise a casting material and phosphor particles, wherein the phosphor particles are embedded in the casting material. Phosphor particles are fluorescent particles that absorb the electromagnetic radiation of a first peak wavelength emitted by the semiconductor chip and convert it into electromagnetic radiation of a second peak wavelength, wherein the second peak wavelength is different from the first peak wavelength and is in particular greater than the first peak wavelength. The envelope can contain phosphor particles of various types that convert radiation of the first peak wavelength into radiation of different peak wavelengths so that light that appears white to the human eye arises from a mixture of the emitted and converted radiations.

By virtue of the design that the envelope completely covers the front side of the semiconductor chip and at least partially covers the side surfaces of the semiconductor chip, the color location stability of the component over radiation angles can be improved. The envelope having the casting material and the phosphor particles embedded therein can be formed as a single layer, in particular in one piece. The envelope can be formed by a single casting layer formed for instance in a single process step. The interface of the envelope facing the semiconductor chip and adjoining the contour of the semiconductor chip can thus be formed by a surface of the casting layer.

The envelope may have a converter layer comprising phosphor particles. The converter layer covers the front side of the semiconductor chip completely and the side surfaces of the semiconductor chip at least partially. In particular, the converter layer is non-planar. The converter layer can have a substantially constant layer thickness. In particular, this leads to better heat dissipation of the converter layer and to a particularly even color location distribution.

In this case, the envelope may include the converter layer and the casting layer, wherein the converter layer is located between the semiconductor chip and the casting layer. It is possible for the converter layer and the casting layer to have the same matrix material, wherein the converter layer has a significantly higher concentration of phosphor particles than the casting layer, about at least three, five, ten or at least twenty times higher. When in doubt, the converter layer can be regarded as part of the casting layer if the converter layer and the casting layer have the same matrix material and the converter layer is formed by sedimentation of phosphor particles or by a similar process. In this case, the phosphor particles are not distributed evenly or substantially evenly in the envelope. The envelope is divided in particular into two subregions, with a first subregion forming the casting layer and a second subregion forming the converter layer. Alternatively, the converter layer can be formed as an independent layer arranged between the casting layer and the semiconductor chip. In this case, in addition to the concentration of phosphor particles, the converter layer and the casting layer may differ in terms of their material composition, for example.

Both the converter layer and the casting layer can each have a surface facing the semiconductor chip and reproduces the contour of the semiconductor chip and/or of the reflector. The converter layer can be formed such that, in a plan view, it completely covers the semiconductor chip and at least partially covers the reflector, wherein a surface of the converter layer forms the interface of the envelope facing the semiconductor chip and the reflector. For example, the interface reproduces the contour of the semiconductor chip in regions and the contour of the reflector in regions. In particular, the converter layer directly adjoins the semiconductor chip and the first and second subregions of the reflector. The non-planar design of the converter layer that covers the front side and side surfaces of the semiconductor chip ensures particularly high color stability over the radiation angles of the component.

The semiconductor chip may be mechanically stably attached to the first subregion of the reflector at least in regions by the envelope. The semiconductor chip can be attached to the first subregion of the reflector by the second part at least in places. The first subregion of the reflector may be formed to be separate from the second subregion of the reflector. In particular, the first subregion of the reflector forms a cavity in which the semiconductor chip is arranged or fixed. In the lateral direction, the second subregion of the reflector is located between the semiconductor chip and the first subregion of the reflector, wherein the second subregion can serve as an adhesive bond between the semiconductor chip and the first subregion of the reflector.

The semiconductor chip may have a first contact layer on its rear side for the purpose of external electrical connecting. In a plan view, the reflector and the first contact layer can be free of an overlap. Especially on the rear side of the component, the first contact layer is freely accessible and can therefore serve as a first connection surface of the component. The semiconductor chip can have a second contact layer on its rear side for the purpose of electrical connecting. The reflector and the second contact layer can be free of an overlap when viewed from above. The second contact layer is thus freely accessible, in particular at the rear side of the semiconductor chip or at the rear side of the component, and can serve as a further connection surface of the component to electrically connect the component to an external power source, for example. The first and second contact layers of the semiconductor chip are assigned to different electrical polarities of the semiconductor chip.

Alternatively, in a plan view, the contact layers of the semiconductor chip and the reflector may have overlaps. In this case, the electrical contact layers of the semiconductor chip can each be electrically conductively connected to an area of the reflector. The semiconductor chip can therefore be electrically connected to an external power source via the reflector.

The semiconductor chip may have the second contact layer on its front side for the purpose of external electrical connecting. The component comprises, for example, a through-via extending vertically throughout the reflector, for example, throughout the first subregion of the reflector, and electrically conductively connects to the second contact layer of the semiconductor chip. For example, the through-via is arranged laterally to the semiconductor chip and has no overlaps with the semiconductor chip when viewed from above. The rear side of the component has a connection surface that is in electrical contact with the through-via. Thus, the component can further be electrically contactable exclusively via its rear side.

The component may have an electrically conductive carrier layer. The conductive carrier layer comprises in particular a first sublayer and a second sublayer laterally spaced apart from the first sublayer. The semiconductor chip and/or the reflector can be arranged on the carrier layer. In particular, the semiconductor chip electrically conductively connects to the first sublayer and the second sublayer. The electrically conductive carrier layer delimits the component, especially in the vertical direction, and comprises a surface forming the rear side of the component. The component can thus be formed as a surface-mountable component, wherein the component can be electrically contacted via the first and second sublayers of the electrically conductive carrier layer. The electrically conductive carrier layer is especially planar.

The first subregion and the second subregion of the reflector may be electrically insulating. In particular, the first subregion and/or the second subregion may each contain a matrix material in which light-reflecting particles are embedded. In particular, the matrix material is transmissive, especially transparent to radiation. The reflectivity of the reflector can be adjusted in particular by the distribution and concentration of the light-reflecting particles. In particular, the reflector is formed such that at least 50%, at least 70% or at least 90% of the electromagnetic radiation incident on the reflector is reflected back for instance in a forward direction. The reflector can have a matrix material such as an epoxy or silicone. Alternatively, the matrix material can be a thermoplastic material or a ceramic material. In this case, the reflectivity of the reflector can be increased by adding reflective fillers.

The first and second subregions of the reflector are manufactured in different process steps. The first and second subregions can have a common interface observable in the finished component. The first and second subregions can have the same or different material compositions.

The envelope may have a surface facing away from the semiconductor chip, which is convex at least in regions. For example, this surface can take the form of a surface of an optical element such as a lens. It is also possible that, to enhance light extraction, the surface of the envelope facing away from the semiconductor chip has depressions and elevations in regions. The surface can also have other shapes. In a plan view, the envelope can cover the semiconductor chip completely and the reflector at least partially or completely. The envelope can contain phosphor particles or be free of phosphor particles. In particular, the envelope is made of a casting material transparent to radiation emitted by the semiconductor chip or radiation converted by the phosphor particles during operation of the component.

In our method of producing one or a plurality of components, a plurality of semiconductor chips may be provided. The semiconductor chips can be arranged on an auxiliary carrier in a plurality of rows and columns. A common reflector is applied to the areas between the rows and columns of the semiconductor chips such that the semiconductor chips are enclosed by the common reflector in the lateral directions. A common envelope is applied to the semiconductor chips and the common reflector such that the common envelope completely covers the semiconductor chips in a plan view. After forming the envelope, the components are singulated by separating the common reflector in the areas between the rows and columns of the semiconductor chips so that the singulated components each have at least one semiconductor chip, one reflector and one envelope. The reflector and the envelope of the respective component thus emerge from the common reflector and the common envelope, respectively. The auxiliary carrier on which the semiconductor chips are arranged can be removed from the components prior to, during or after the singulation step.

The common reflector may be provided at least partially prefabricated. For example, the common, in particular contiguous reflector has a plurality of open cavities, wherein the semiconductor chips can be arranged in each of the open cavities. Such cavities are particularly free of a bottom surface. The semiconductor chips arranged in the open cavities can thus be electrically contacted throughout the common reflector. The cavities each have side walls formed as the first subregions of the individual reflectors of the respective components to be produced.

After the common reflector has been applied to the areas between the rows and columns such that the semiconductor chips are arranged in the cavities of the common reflector, the common reflector can subsequently be mechanically fixed to the semiconductor chips. For example, a reflector material is used to form a mechanical connection between the respective semiconductor chip and the respective first subregion of the associated reflector. The reflector material forms in particular the second subregion of the associated reflector. The reflector material can partially cover the side surfaces of the semiconductor chip. The reflector material can be formed such that it directly adjoins in particular the first subregion of the associated reflector, which is laterally spaced apart from the semiconductor chip.

The envelope can be formed such that it adjoins the semiconductor chips as well as the common reflector, wherein the mechanical stability of the components to be produced is additionally increased. The envelope may contain phosphor particles embedded in a casting layer of the envelope. The phosphor particles can be evenly distributed within the envelope, especially within the casting layer. It is also possible that the envelope contains a converter layer containing phosphor particles, wherein the converter layer differs from the casting layer or is located in an area of the casting layer adjoining the semiconductor chip. For example, the phosphor particles are applied to the semiconductor chips by spray coating or sedimentation or applying a prefabricated converter foil. In sedimentation, the phosphor particles can be located in the same matrix material of the casting layer. However, the phosphor particles have an increased concentration in the immediate vicinity of the semiconductor chip. In this case, the matrix material of the casting layer comprising the phosphor particles embedded therein forms the converter layer. Alternatively, it is also possible that the converter layer is free of a matrix material of the casting layer and therefore differs from the casting layer. The phosphor particles can be arranged exclusively within the converter layer. In particular, the component is free of a separation layer located between the semiconductor chip and a layer containing the phosphor particles. In this case, the component is based on the principle of chip-neighboring conversion.

The common reflector may be formed by sequential application of material layers around the individual semiconductor chips. The material layers can be formed such that the reflector has an increasing vertical height with increasing distance from the corresponding semiconductor chip. In particular, some of the material layers can be formed such that the material layers having a smaller distance to a corresponding semiconductor chip have a lower vertical height than the material layers having a larger distance to the corresponding semiconductor chip. To achieve a growing vertical height of the reflector at a greater distance from the semiconductor chip, the material layers can be partly arranged one above the other.

The method described above is particularly suitable for the production of one or a plurality of components described here. Features described in connection with the component can therefore also be used for the method and vice versa.

Further advantages, preferred configurations and further developments of the component and of the method will become apparent from the examples explained below in conjunction with FIGS. 1 to 9D.

Identical, equivalent or equivalently acting elements are indicated with the same reference numerals in the figures. The figures are schematic representations and thus not necessarily true to scale. Rather, comparatively small elements and particularly layer thicknesses can be illustrated exaggeratedly large for the purpose of better illustration.

FIG. 1 shows a component 100. The component 100 has a semiconductor chip 1, a reflector 2 and an envelope 3. The reflector 2 is arranged as a frame-like structure around the semiconductor chip 1. In lateral directions, the semiconductor chip 1 is fully enclosed by the reflector 2. In a plan view, the envelope 3 completely covers the semiconductor chip 1. The reflector 2 is also covered by the envelope 3.

The component 100 has a front side 101 and a rear side 102 facing away from the front side 101. During operation of the component 100, the semiconductor chip 1 is configured to generate electromagnetic radiation. The front side 101 of the component 100 serves in particular as the radiation exit side of the component 100. In particular, the component 100 is formed as a surface-mountable device.

This means that the component 100 can be electrically contacted externally, in particular via its rear side 102.

According to FIG. 1, the rear side 102 of the component 100 comprises a rear side of the reflector 2 and a rear side 12 of the semiconductor chip 1, while the semiconductor chip 1 has a first contact layer 41 and a second contact layer 42 on its rear side 12. The contact layers 41 and 42 are freely accessible, especially on the rear side 102 of the component 100 so that the semiconductor chip 1 or the component 100 can be electrically connected to an external power source at the rear side 12 or 102.

The semiconductor chip 1 has a front side 11 facing away from the rear side 12. In particular, the semiconductor chip 1 is formed as a volume emitter. This means that during operation of the component 100 the semiconductor chip 1 can emit electromagnetic radiation that can exit from the semiconductor chip 1 particularly at the front side 11 and at the side surfaces 10. The semiconductor chip 1 as shown in FIG. 1 can be electrically contacted externally, in particular exclusively at the rear side 12, namely via its electrical contact layers 41 and 42. In particular, the semiconductor chip is a flip-chip such as a sapphire flip-chip.

The reflector 2 shown in FIG. 1 has a first subregion 21 and a second subregion 22. The first subregion 21 and the second subregion 22 may have the same material composition or different material compositions. In particular, the first subregion 21 and the second subregion 22 are produced by different process steps. In particular, the first subregion 21 encloses the semiconductor chip 1 in a frame-like manner, wherein the first subregion 21 is spatially spaced apart from the semiconductor chip in the lateral direction. The first subregion 21 thus forms a cavity in which the semiconductor chip 1 is arranged. This cavity, as shown in FIG. 1, has a cross-section growing larger from the rear side 102 to the front side 101 of the component 100. The side walls of the cavity run in particular obliquely to the rear side 102 of the component 100 so that electromagnetic radiation that hits the side walls of the cavity can be reflected back in the direction of the front side 101 of the component.

In the lateral direction, the second subregion 22 of the reflector 2 is located between the semiconductor chip 1 and the first subregion 21. In particular, the second subregion 22 adjoins both the semiconductor chip 1 and the first subregion 21 so that the second subregion 22 serves for instance as a connection layer. In particular, the second subregion 22 of the reflector 2 is made of a radiation-transmissive bonding material having light-reflecting particles embedded therein. The second subregion 22 partially covers the side surfaces 10 of the semiconductor chip 1. In particular, the semiconductor chip 1 may be fully enclosed by the second subregion 22 of the reflector 2. In a plan view, the second subregion 22 fills a lateral space between the semiconductor chip 1 and the first subregion 21 of the reflector 2. Radiation in a reverse direction, i.e., in the direction of the rear side 102, and potential light losses in the reverse direction can thus be avoided. Emission via the rear side of the semiconductor chip 1 or of the component 100 can be reduced by up to 100%. In particular, the second subregion 22 covers only a smaller portion, for instance at most 40%, at most 30%, at most 20% or at most 10% of the side surfaces 10 of the semiconductor chip 1 so that the radiation emitted by the semiconductor chip 1 can continue to escape from the semiconductor chip 1 over a large part of the side surfaces 10.

In FIG. 1, in a plan view, the envelope 3 covers the front side 11 of the semiconductor chip 1 completely and the side surfaces 10 of the semiconductor chip 1 partially. The envelope thus has an interface 32 facing the semiconductor chip 1 or the reflector 2 that reproduces or reflects a contour of the semiconductor chip 1 or a contour of the reflector 2 in regions. The envelope 3 has a surface 31 facing away from the interface 32 and forms in particular the front side 101 of the component 100. The envelope 3 can be formed in a single-layered fashion or in a multi-layered fashion.

As shown in FIG. 1, the envelope 3 may be formed from a single casting layer 34 formed in particular in one piece. The casting layer 34 can be produced in a single process step. The casting layer 34 can be made of a radiation-transmissive casting material. It is possible that phosphor particles are embedded in the casting material of the casting layer 34 or of the envelope 3. The phosphor particles are configured in particular to at least partially convert the electromagnetic radiation of a first peak wavelength emitted by semiconductor chip 1 into electromagnetic radiation of a second peak wavelength, wherein the second peak wavelength differs from the first peak wavelength. The envelope can contain different types of phosphor particles. It is also possible that the envelope 3 or the component 100 is free of phosphor particles. The component 100 is formed in particular with regard to the presence or absence of phosphor particles or to their composition such that in operation they emit white or colored light.

According to FIG. 1, the semiconductor chip 1 can be electrically connected throughout the reflector 2. In particular, the reflector 2 and the contact layers 41 and 42 of the semiconductor chip 1 have no overlaps when viewed from above. In particular, the rear side of reflector 2 and the rear side 12 of the semiconductor chip 1 can be flush with each other at least in regions.

Figure 2:
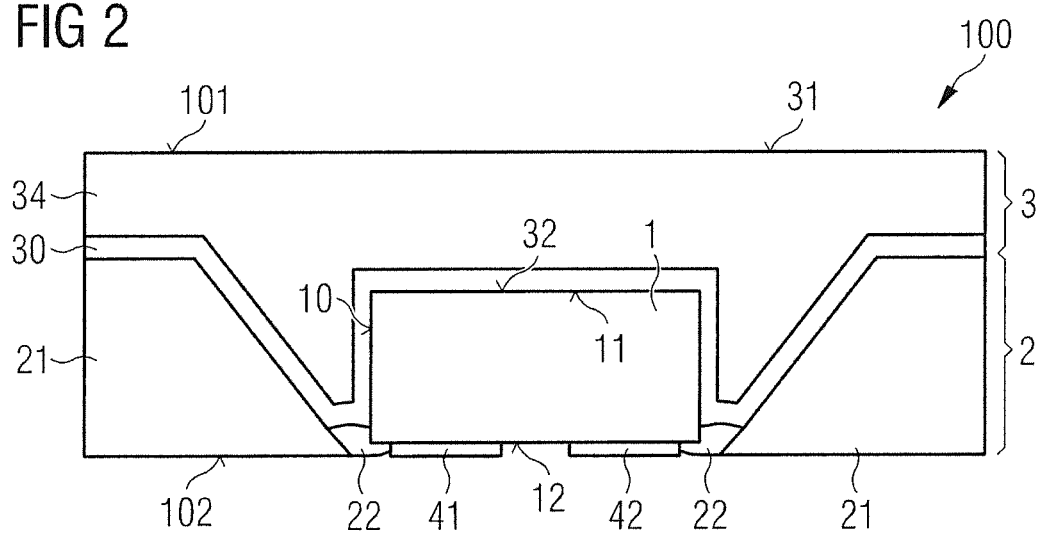

The example for a component 100 shown in FIG. 2 essentially corresponds to the example shown in FIG. 1. In contrast to this, the envelope 3 has a converter layer 30. The converter layer 30 is arranged in the vertical direction between the casting layer 34 and the semiconductor chip 1 or the reflector 2. In particular, the casting layer 34 is free of phosphor particles or shows only slight traces of phosphor particles. Preferably, the converter layer 30 directly adjoins the semiconductor chip 1 and the reflector 2. In a plan view, the converter layer 30 completely covers the semiconductor chip 1 and/or the reflector 2. The converter layer 30 partially covers the side surfaces 10 of semiconductor chip 1. However, the side surfaces 10 of the semiconductor chip 1 are completely covered by the converter layer 30 and by the second subregion 22 of the reflector 2. In deviation from this, it is also possible for the side surfaces 10 to be not completely covered by the converter layer 30 and the second subregion 22 of the reflector, but the color distribution over angles can nevertheless be made particularly homogeneous, for example, by a complete covering of the semiconductor chip 1 by the converter layer 30 or the envelope 3 having the phosphor particles embedded therein.

The converter layer 30 has a non-planar shape. In particular, the converter layer 30 has a substantially constant layer thickness, i.e., constant down to manufacturing tolerances, for example. In deviation from this, it is also possible that the converter layer 30 does not have a constant layer thickness, for example, if the converter layer 30 is formed by sedimentation or spray coating. The converter layer 30 can be different from the casting layer 34. It is also possible that the converter layer 30 and the casting layer 30 have the same matrix material, wherein the converter layer 30 has an increased concentration of phosphor particles compared to the casting layer 34, for instance at least three times, ten times or at least twenty times higher. The converter layer 30 can therefore be part of the casting layer 34 having an increased concentration of phosphor particles.

The converter layer 30 has a surface facing the semiconductor chip 1 and the reflector and forms the interface 32 of the envelope 3. As a non-planar layer, the converter layer 30 reproduces the contour of semiconductor chip 1 in regions and the contour of reflector 2 in regions. In particular, the casting layer 34 directly adjoins the converter layer 30 so that the casting layer 34 also has a surface facing the semiconductor chip 1 and the reflector 2 and reproduces the contour of the semiconductor chip 1 or of the reflector 2.

The phosphor particles embedded in the converter layer 30 according to FIG. 2 or in the casting layer 34 according to FIG. 1 can be applied to the semiconductor chip 1 or the reflector 2 by a non-planar conversion technique, for example, by spray coating, volume conversion or sedimentation. Since the first subregion 21 of the reflector 2 can be freely formed, in particular the height, width, angle of inclination, shape or material of the cavity of the reflector 2 can be formed independently from the chip dimensions and, if necessary, from the conversion technology. In particular, an upper edge of reflector 2 may be higher or lower than the front side 11 of the semiconductor chip 1. The variability of the conversion technology simplifies the realization of an optimized design of the component and/or enables the use of cost-effective manufacturing processes.

The phosphor particles embedded in the envelope 3, namely in the converter layer 30 and/or in the casting layer 34, can be selectively applied to the semiconductor chip 1 and the cavity of the reflector 2 with regard to their distribution or concentration using suitable, in particular non-planar conversion technology, wherein the freely designable shape of the cavity offers the possibility of influencing the radiation properties of component 100 in a targeted manner, for example, with regard to the color location stability over radiation angles. The shape of the cavity can also be controlled with regard to a preferred conversion and casting techniques. In particular, the choice with regard to shape and material of the reflector 2 can take into account mechanical aspects for instance to avoid difficulties in handling ultra-small components having adhesive surfaces.

Figure 3:
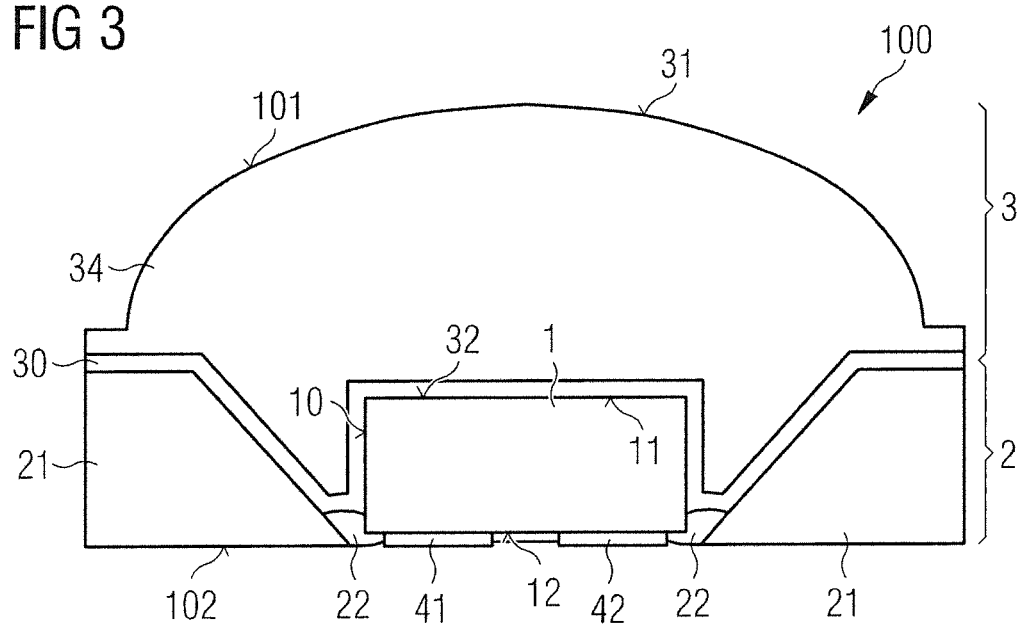

The example for a component 100 shown in FIG. 3 essentially corresponds to the example shown in FIG. 2. Alternatively or in addition to the example shown in FIG. 2, the envelope has a surface 31 facing away from the semiconductor chip 1 and takes the form of a surface of an optical element such as of a lens, at least in regions. The surface 31 of the envelope 3 in FIG. 3 is a surface of the casting layer 34 and forms the front side 101 of the component 100. In virtue of varying the thickness of the casting layer 34 along the lateral direction, the casting layer 34 can act as a lens to achieve an even spatial distribution of the light emitted during operation of the component 100. In contrast to FIG. 3, the surface 31 can be a generally convex surface or a surface having elevations and depressions. Other forms of the surface 31 are also possible for the purpose of improving light extraction, for example, as the surface of a lens having cut vertical edges or even of a cube.

Figure 4:
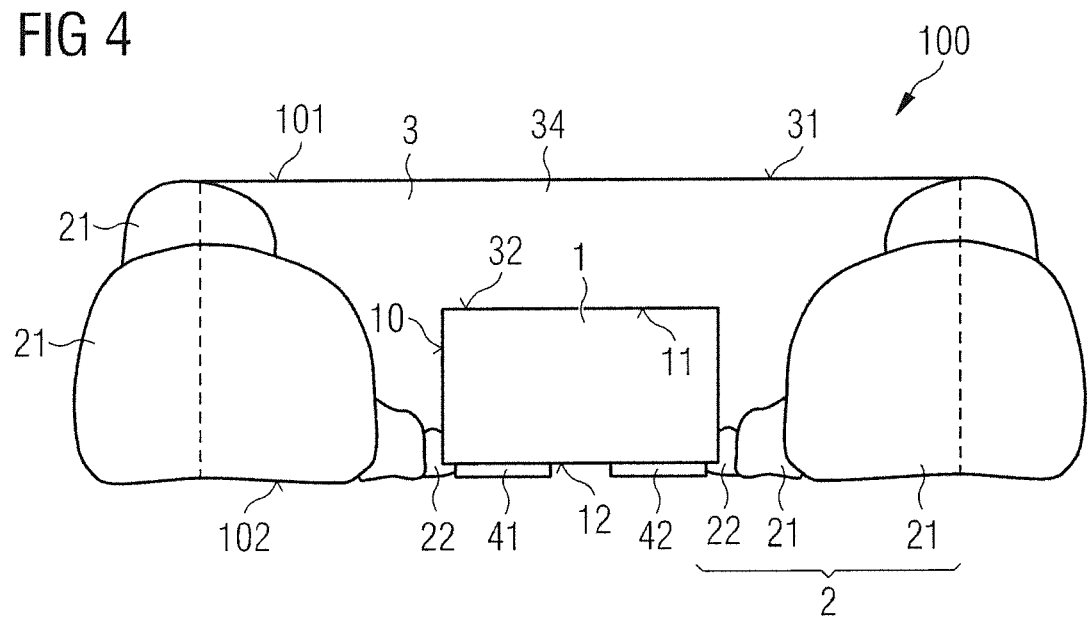

The example of component 100 shown in FIG. 4 essentially corresponds to the example shown in FIG. 1. In contrast to this, the reflector 2 has a plurality of first subregions 21. The plurality of the first subregions 21 and the second subregion 22 of the reflector 2 can be formed by sequential application of material layers around semiconductor chip 1. The plurality of the first subregions 21 and the second subregion 22 may have the same material composition or different material compositions. The resulting cavity of the reflector 2 has inner surfaces having different curvatures in different areas. The dashed lines shown in FIG. 4 represent separating lines that separate adjacent reflectors 2 of different components 100 from each other. When producing a plurality of components 100, the components 100 can be separated along such separating lines.

In particular, the reflector 2 shown in FIGS. 1 to 4 is formed to be electrically insulating. The reflector 2 may have one or more matrix materials in which light-reflecting particles such as silicon oxide, titanium oxide particles or other white particles, are embedded. In particular, the matrix material is a low-refractive-index material, i.e., a material having a refractive index smaller than 2, in particular smaller than 1.7 or smaller than 1.5. The light-reflecting particles embedded in the matrix material generally have a higher refractive index than the matrix material. The electrically insulating reflector 2 is particularly free of a metallic layer or of a metal layer such as a silver layer. The reflector 2 therefore contains no optically active metallic surfaces, especially no silver-coated surfaces that are particularly sensitive to corrosion. The components that are free of a silver coating can be used outdoors without any concerns about corrosion resistance.

Figure 5:
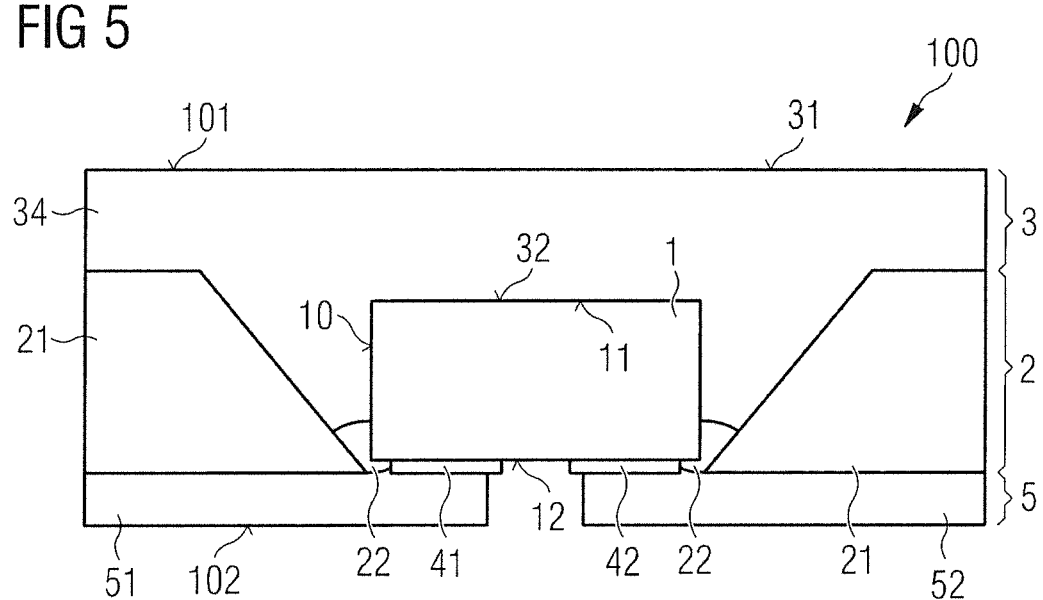

The example for a component 100 shown in FIG. 5 essentially corresponds to the example shown in FIG. 1. Alternatively or in addition to the examples described here, the component 100 as shown in FIG. 5 has an electrically conductive carrier layer 5 on which the semiconductor chip 1 and the reflector 2 are arranged. The electrically conductive carrier layer 5 has a first sublayer 51 and a second sublayer 52 laterally spaced apart from the first sublayer 51. The semiconductor chip 1 electrically connects to the electrically conductive carrier layer 5. FIG. 5 shows that the first contact layer 41 lies on the first sublayer 51 and is in electrical contact with it. In particular, the second contact layer 42 of the semiconductor chip 1 lies on the second sublayer 52 and is in electrical contact with it.

The electrically conductive carrier layer 5 is formed in particular from a metal such as copper or aluminum, or from a metal alloy such as NiSn, NiAg, NiPdAu or CuW. Preferably, the carrier layer 5 is formed as a planar metal foil. For example, the electrically conductive carrier layer 5 can be formed on the semiconductor chip 1 and/or on the reflector 2 by an electroplating process. The carrier layer 5 thus serves as a substructure for better stabilization of the component and/or better spreading of heat and/or easier assembly using solder.

Figure 6:
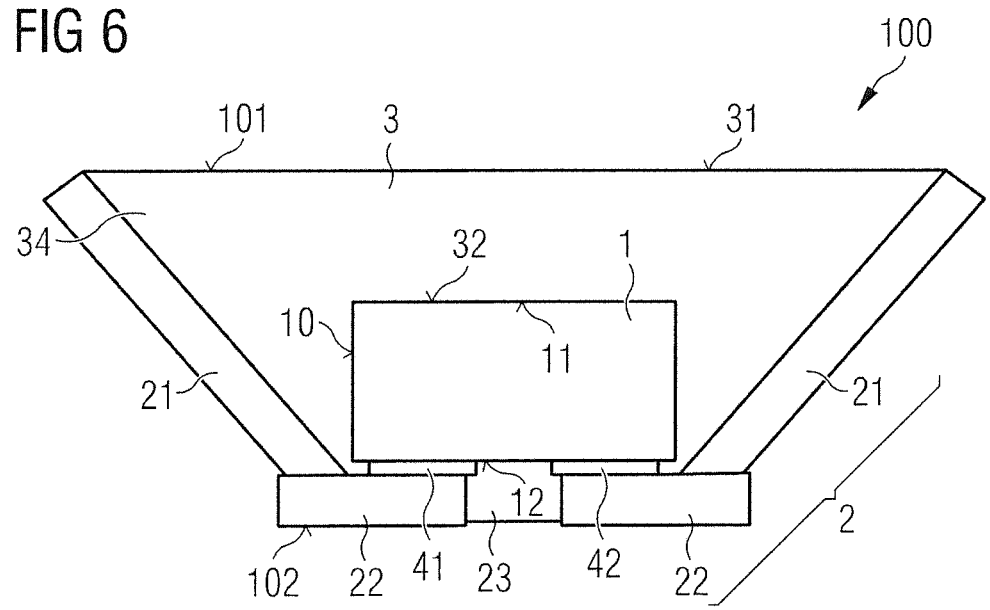

FIG. 6 shows an alternative example of a component 100. In contrast to the examples described so far, the reflector 2 is metallic and comprises the first subregion 21 and the second subregion 22. The reflector 2 thus has a metallic shaped component. The semiconductor chip 1 electrically conductively connects to the reflector 2. The semiconductor chip 1 can be electrically externally contacted via the reflector 2. The reflector 2 has a third subregion 23 made in particular of an electrically insulating material. The third subregion 23 is especially configured to electrically isolate different subregions of the reflector 2 from each other. In FIG. 6, with the exception of an adhesion promoter layer, the second subregion 22 is directly adjacent to the first contact layer 41 or the second contact layer 42 of the semiconductor chip 1 and thus directly adjacent to the semiconductor chip 1. The first subregion 21, on the other hand, is spatially spaced apart from the semiconductor chip 1 in the lateral direction. The third subregion 23 of the reflector 2 can comprise a radiation-transmissive matrix material in which light-reflecting particles are embedded. For example, the third subregion 23 acts as a solder resist layer.

The example for a component 100 shown in FIG. 7 essentially corresponds to the example shown in FIG. 2. In contrast to this, the semiconductor chip 1 has a first contact layer 41 on the rear side 12 and a second contact layer 42 on the front side 11. In a plan view, the reflector 2 and the first contact layer 41 are free of overlap. The first contact layer 41 covers the semiconductor chip completely. The first contact layer 41 can be radiation-reflective. The component 100 has a through-via 40 extending in the vertical direction throughout the reflector 2, in particular throughout the first subregion 21 of the reflector 2. The second contact layer 42 can be electrically connected to the through-via 40 via a connection means 43, for example, via a bonding wire connection so that the component 100 can be electrically contacted externally exclusively via the rear side 102.

The semiconductor chip 1 shown in FIG. 7 is in particular a thin-film semiconductor chip. The thin-film semiconductor chip 1 is free of a growth substrate. The semiconductor chip 1 has in particular an electrically conductive substrate 13 on which a functional layer stack 14 is arranged. During operation of the semiconductor chip 1 or the component 100, the functional layer stack 14 is especially configured to generate electromagnetic radiation in the visible, infrared or ultraviolet spectral range. The semiconductor chip shown in FIGS. 1 to 6 can also have such a functional layer stack 14.

The example of component 100 shown in FIG. 8 essentially corresponds to the example shown in FIG. 3 having the electrical connection according to FIG. 7. Unlike FIGS. 3 and 7, the component 100 shown in FIG. 8 is free of a converter layer 30. In particular, it is possible that the casting layer 34 or the entire envelope 3 is free of phosphor particles. For instance, the semiconductor chip 1 is formed such that it emits 100 colored light during operation of the component. Deviating from FIG. 8, the component 100 shown in FIG. 8 may have a converter layer 30 as shown in FIG. 7.

FIGS. 9A to 9D illustrate various steps of a method of producing a plurality of components 100.

Figure 9A:
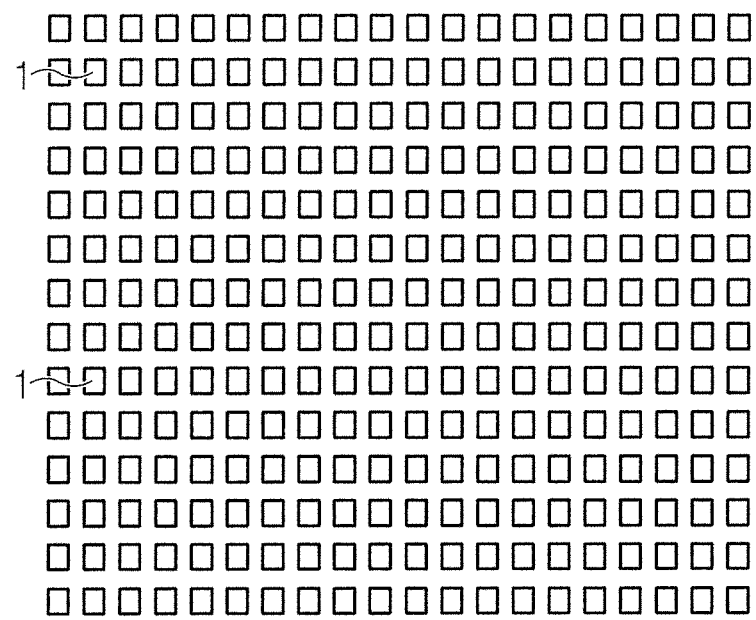
FIGS. 9A, 9B, 9C and 9D show schematic representations of different process steps of a method of producing a plurality of components.

According to FIG. 9A, a plurality of semiconductor chips 1 are arranged in a plurality of rows and columns. The semiconductor chips 1 can be arranged on an auxiliary carrier, for example, on an adhesive tape (not shown here). The auxiliary carrier can be a mechanically stable or a flexible, in particular reversibly stretchable carrier.

Figure 9B:
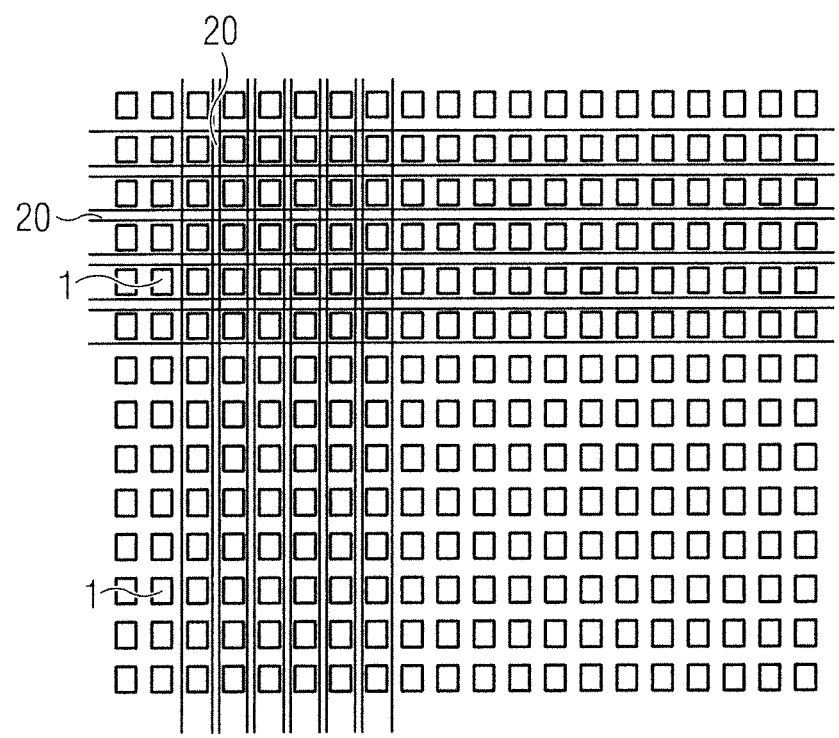

According to FIG. 9B, a common reflector 20 is applied to the areas between the rows and columns of semiconductor chips 1 such that the semiconductor chips 1 are each surrounded by the common reflector 20 in lateral directions. In particular by a process of linear dispensing, the common reflector 20 can be formed by forming a plurality of strips made of light-reflecting material, for instance of light-transmissive low-refractive material having white particles embedded therein. The individual semiconductor chips 1 are framed by parts of the common reflector 20. After the common reflector 20 has been cured, an envelope having phosphor particles embedded therein or comprising a converter layer can be applied to the plurality of semiconductor chips 1 and to the common reflector 20.

Figure 9C:
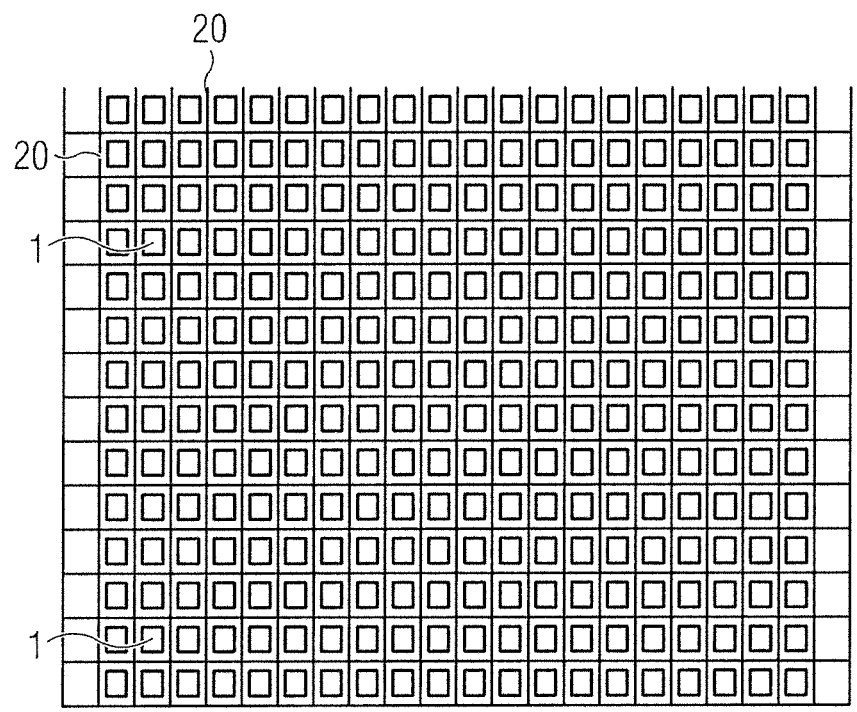

It is also possible that the common reflector is formed by sequential application of material layers around the individual semiconductor chips 1 so that a plurality of components 100 as shown in FIG. 4 are produced after a singulation step. Alternatively, it is also possible, as shown in FIG. 9C, to provide the common reflector 20 at least partially prefabricated. Such a prefabricated reflector 20, in particular a contiguous reflector 20, has in particular only the first subregions 21 forming the walls of a plurality of cavities of the common reflector 20. The cavities are particularly free of a bottom surface.

The common reflector 20 can be applied to the areas between the rows and columns of the semiconductor chips, wherein the common reflector is subsequently mechanically attached to the semiconductor chips 1. During the subsequent attachment, a reflector material can be formed between the semiconductor chips 1 and the common reflector 20 before or after the common reflector 20 has been applied, wherein the reflector material establishes a mechanical connection between the semiconductor chips and the common reflector 20. According to FIG. 9B, the reflector material is applied around the individual semiconductor chips 1 to form the corresponding second subregions 22 before the partially prefabricated common reflector 20 has been applied. The reflector material is subsequently cured, for example, by thermal treatment.

Figure 9D:
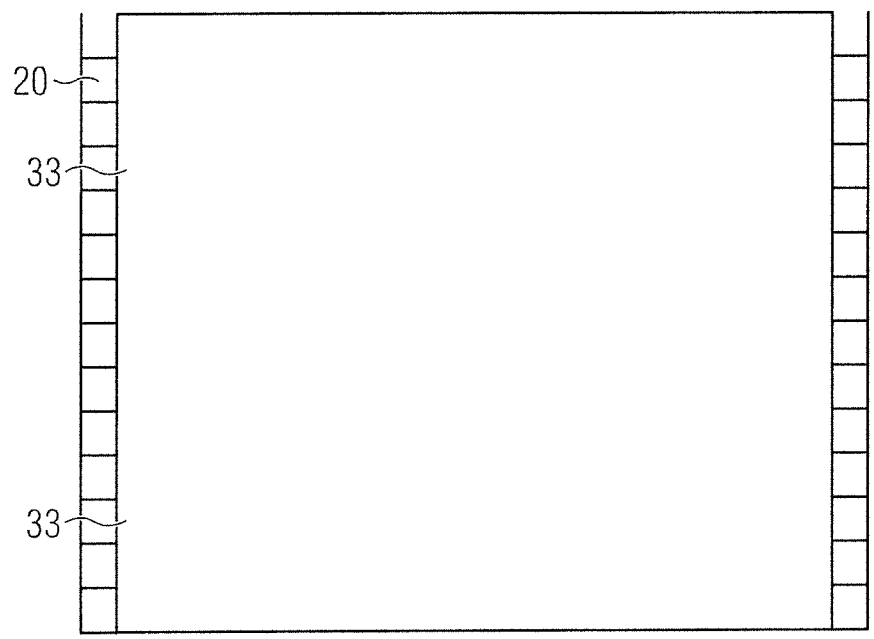

According to FIG. 9D, a common envelope 33 is applied to the semiconductor chips 1 and the common reflector 20 after the common reflector 20 has been formed so that the common envelope 33 completely covers the semiconductor chips 1 in a plan view. The common envelope 33 can be formed as a single layer. For example, the common envelope 33 comprises a radiation-transmissive encapsulation material into which phosphor particles are introduced. Alternatively, it is also possible for the common envelope 33 to have a multi-layered design. In this case, the envelope may have a casting layer 34 that is particularly free of phosphor particles or contains only slight traces of phosphor particles. In addition to the casting layer 34, the common envelope may have a converter layer 30 which is in particular of non-planar design, is arranged between the casting layer 34 and the semiconductor chips 1 and reproduces a contour of the semiconductor chips 1 or the common reflector 20.

The common envelope, if necessary having phosphor particles embedded therein, can be applied to the semiconductor chips 1 at least partially by a casting process. A casting process is generally understood as a process by which a cavity is filled for instance with a molding compound without an additional shaping step or by which a molding compound can be shaped and, if necessary, cured under pressure according to a given shape. In particular, the term "casting" includes molding, injection molding, transfer molding and compression molding. The phosphor particles can be applied to the semiconductor chips 1 by spray coating, volume conversion or sedimentation in combination with the casting process. In a subsequent process step, the common envelope is cured by a thermal treatment, for example. Hardening can be carried out partially or completely separately. For example, during spray coating, the converter layer is typically cured before a clear casting material is added and later cured.

The semiconductor chips 1, the common reflector 20 and the common envelope can be singulated into a plurality of components 100 by cutting, for instance by sawing the common reflector 20 and/or the common envelope 33 in particular in the areas between the rows and columns of the semiconductor chips 1 so that the singulated components 100 each have at least one semiconductor chip 1, one reflector 2 and one envelope 3. The auxiliary carrier on which the individual components 100 are arranged can be removed from the components 100 prior to or after the singulating step or during the singulating step.

Our components and methods are not restricted to the examples by the description made with reference to examples. This disclosure rather comprises any novel feature and any combination of features, including in particular any combination of features in the appended claims, even if the feature or combination is not itself explicitly indicated in the claims or examples.

This application claims priority of DE 10 2016 106 833.0, the subject matter of which is incorporated herein by reference.

The invention claimed is:

1. A component comprising a semiconductor chip, an envelope and a reflector, wherein
   the semiconductor chip has a front side, a rear side facing away from the front side and side faces, and the semiconductor chip is electrically contactable at least partially via its rear side,
   the reflector completely encloses the semiconductor chip in lateral directions, has a first subregion and a second subregion directly adjoining the first subregion, and the first subregion is spatially spaced from the semiconductor chip and the second subregion directly adjoins the semiconductor chip,
   the envelope covers the front side of the semiconductor chip completely and the side surfaces of the semiconductor chip at least partially so that the envelope has an interface facing the semiconductor chip and reproducing a contour of the semiconductor chip in regions,
   the component is free of a leadframe enclosed by a molded body,
   the component has a rear side comprising the rear side of the semiconductor chip and a rear side of the reflector, and
   for the purpose of external electrical contacting, the semiconductor chip has a freely accessible first contact layer on its rear side.

2. The component according to claim 1, wherein the semiconductor chip is electrically contactable via the reflector or throughout the reflector.

3. The component according to claim 1, wherein the envelope comprises a casting material and phosphor particles, and the phosphor particles are embedded in the casting material.

4. The component according to claim 1, wherein the envelope has a converter layer comprising phosphor particles, the converter layer covers the front side of the semiconductor chip completely and the side surfaces of the semiconductor chip at least partially, and the converter layer is of non-planar construction.

5. The component according to claim 4, wherein in a plan view, the converter layer covers the semiconductor chip completely and the reflector at least partially, and a surface of the converter layer forms the interface of the envelope facing the semiconductor chip and the reflector and reproduces the contour of the semiconductor chip in regions and a contour of the reflector in regions.

6. The component according to claim 1, wherein, at least in regions, the semiconductor chip is attached to the first subregion of the reflector by the envelope in a mechanically stable manner.

7. The component according to claim 1, wherein the semiconductor chip is a flip-chip and comprises a second contact layer on its rear side and is externally electrically contactable exclusively at its rear side via the first and second contact layers.

8. The component according to claim 1, wherein, for the purpose of external electrical contacting, the semiconductor chip has a second contact layer on its rear side, and in a plan view, the reflector and the second contact layer are free of an overlap, and the first contact layer and the second contact layer are assigned to different electrical polarities of the semiconductor chip.

9. The component according to claim 1, wherein, for the purpose of external electrical contacting, the semiconductor chip has a second contact layer on its front side, and the component comprises a through-via extending in the vertical direction throughout the reflector and electrically conductively connects to the second contact layer.

10. The component according to claim 1, wherein the first subregion and the second subregion of the reflector are each formed to be electrically insulating, and the reflector comprises a matrix material and light-reflecting particles embedded in the matrix material.

11. The component according to claim 1, wherein the first subregion and the second subregion of the reflector are manufactured in different process steps and/or have different material compositions.

12. The component according to claim 1, further comprising an electrically conductive carrier layer having a first sublayer and a second sublayer laterally spaced apart from the first sublayer, wherein the semiconductor chip and the reflector are arranged on the carrier layer and the semiconductor chip electrically conductively connects to the first sublayer and the second sublayer.

13. The component according to claim 1, wherein the reflector is metallic, and the semiconductor chip electrically conductively connects to the reflector.

14. The component according to claim 1, wherein the envelope has a surface facing away from the semiconductor chip and is convex at least in regions.

15. A method of producing a plurality of the components according to claim 1, comprising:
   providing a plurality of semiconductor chips and arranging the semiconductor chips into a plurality of rows and columns;
   applying a common reflector to the regions between the rows and columns of the semiconductor chips such that the semiconductor chips are each surrounded by the common reflector in lateral directions;
   applying a common envelope to the semiconductor chips and to the common reflector such that in a plan view, the common envelope completely covers the semiconductor chips; and
   singulating the components by separating the common reflector in the regions between the rows and columns of the semiconductor chips so that the components each comprise at least one semiconductor chip, one reflector and one envelope.

16. The method according to claim 15, wherein the common reflector is provided at least in a partially prefabricated manner and applied to the regions between the rows and columns of the semiconductor chips, and the common reflector is subsequently mechanically fixed to the semiconductor chips.

17. The method according to claim 15, wherein the common reflector is formed by sequential application of material layers around the individual semiconductor chips.

18. A component comprising a semiconductor chip, an envelope and a reflector, wherein
   the semiconductor chip has a front side, a rear side facing away from the front side and side faces, and the semiconductor chip is electrically contactable at least partially via its rear side,
   the reflector completely encloses the semiconductor chip in lateral directions, has a first subregion and a second subregion directly adjoining the first subregion, and the first subregion is spatially spaced from the semiconductor chip and the second subregion directly adjoins the semiconductor chip, the envelope covers the front side of the semiconductor chip completely and the side surfaces of the semiconductor chip at least partially so that the envelope has an interface facing the semiconductor chip and reproducing a contour of the semiconductor chip in regions, the component has a rear side comprising the rear side of the semiconductor chip and a rear side of the reflector, for the purpose of external electrical contacting, the semiconductor chip has a freely accessible first contact layer on its rear side, and at least in regions, the semiconductor chip is attached to the first subregion of the reflector by the envelope in a mechanically stable manner.

19. The component according to claim 18, wherein the rear side of the semiconductor chip and the rear side of the reflector are flush with each other in places, and the semiconductor chip is a flip-chip.

20. A component comprising a semiconductor chip, an envelope and a reflector, wherein the semiconductor chip has a front side, a rear side facing away from the front side and side faces, and the semiconductor chip is electrically contactable at least partially via its rear side, the reflector completely encloses the semiconductor chip in lateral directions, has a first subregion and a second subregion directly adjoining the first subregion, the first subregion is spatially spaced from the semiconductor chip and the second subregion directly adjoins the semiconductor chip, and the first subregion and the second subregion have the same material composition, the reflector has a cavity whose inner surfaces have different curvatures in different areas, the envelope covers the front side of the semiconductor chip completely and the side surfaces of the semiconductor chip at least partially so that the envelope has an interface facing the semiconductor chip and reproducing a contour of the semiconductor chip in regions, the component has a rear side comprising the rear side of the semiconductor chip and a rear side of the reflector, and for the purpose of external electrical contacting, the semiconductor chip has a freely accessible first contact layer on its rear side.

* * * * *